(12) United States Patent
Valentine et al.

(10) Patent No.: US 12,055,416 B2
(45) Date of Patent: Aug. 6, 2024

(54) STAND FOR A TEST AND MEASUREMENT INSTRUMENT

(71) Applicant: Tektronix, Inc., Beaverton, OR (US)

(72) Inventors: Chris A. Valentine, Portland, OR (US); David M. Ediger, Portland, OR (US); Prashanth Thota, Tigard, OR (US)

(73) Assignee: Tektronix, Inc., Beaverton, OR (US)

( * ) Notice: Subject to any disclaimer, the term of this patent is extended or adjusted under 35 U.S.C. 154(b) by 135 days.

(21) Appl. No.: 17/953,234

(22) Filed: Sep. 26, 2022

(65) Prior Publication Data
US 2023/0016996 A1  Jan. 19, 2023

Related U.S. Application Data

(63) Continuation-in-part of application No. 29/809,745, filed on Sep. 29, 2021, now Pat. No. Des. 1,003,181, which is a continuation-in-part of application No. 29/706,063, filed on Sep. 17, 2019, now abandoned.

(60) Provisional application No. 63/299,882, filed on Jan. 14, 2022.

(51) Int. Cl.
*G01D 11/30* (2006.01)
(52) U.S. Cl.
CPC .................. *G01D 11/30* (2013.01)

(58) Field of Classification Search
CPC ...................................................... G01D 11/30
See application file for complete search history.

(56) References Cited

U.S. PATENT DOCUMENTS

| | | | | |
|---|---|---|---|---|
| 4,917,342 A | * | 4/1990 | Fast | G09F 3/18 248/459 |
| 2006/0108483 A1 | * | 5/2006 | Wolff | G06F 1/1632 248/122.1 |
| 2017/0064852 A1 | * | 3/2017 | Mercier | F16M 13/00 |

FOREIGN PATENT DOCUMENTS

CN   115875544 A   *   3/2023   ............. F16M 11/22

* cited by examiner

*Primary Examiner* — Jamel E Williams
(74) *Attorney, Agent, or Firm* — Miller Nash LLP; Andrew J. Harrington

(57) ABSTRACT

A stand for receiving a portable test and measurement instrument includes a base plate, a first portion extending orthogonally from the generally flat base, the first portion including one or more holes spaced in a pattern through which one or more fasteners may attach the test and measurement instrument to the stand, and a second portion adjacent to and extending at an angle from the first portion, the second portion including one or more holes spaced in a pattern through which one or more fasteners may attach the test and measurement instrument to the stand.

20 Claims, 19 Drawing Sheets

STAND FOR A TEST AND MEASUREMENT INSTRUMENT

CROSS-REFERENCE TO RELATED APPLICATIONS

This disclosure claims benefit of U.S. Provisional Application No. 63/299,882, titled "STAND FOR A TEST AND MEASUREMENT INSTRUMENT," filed on Jan. 14, 2022, and U.S. Design patent application Ser. No. 29/809,745, titled "TEST AND MEASUREMENT INSTRUMENT AND ACCESSORIES," filed Sep. 29, 2021, the disclosures of both of which are incorporated herein by reference in their entirety.

TECHNICAL FIELD

This disclosure relates to test and measurement instruments, and more particularly to a stand for a test and measurement instrument that can be used in conjunction with an instrument.

BACKGROUND

Test and measurement instruments, such as oscilloscopes, have traditionally been large and bulky benchtop instruments. These instruments are typically heavy, with enough bottom surface area to keep the instrument stable on the benchtop and keep the instrument's display perpendicular to the bench. Some instruments also include collapsible feet to allow a user to raise the front edge and change the viewing angle of the display. Such instruments, however, take up significant space on benchtops due to their size, and they are generally not portable or movable in ways that users often need. And generally, even where instruments allow for adjustment of viewing angle, the available adjustment is small and limited. Instruments typically do not provide additional positions that may be more convenient or practical for particular use scenarios. Some users, for example, may need to bring a portable test and measurement instrument to multiple locations for field work, for example, and may need to utilize multiple positions, switching between tables, the ground, or whatever surface might be available. An instrument that is limited to use only while upright or while tilted slightly back may not serve such a user's needs.

Over time, manufacturers have been able to reduce the size of weight of test and measurement instruments, creating more portable, lightweight instruments. Many of these instruments resemble computer tablets, with flatter form factors. As the size, weight, and form factors of test and measurement instruments have developed, however, instruments have become more difficult to keep stable when placed on a benchtop or on a desired surface in the field. A flatter instrument, for instance, is more prone to tipping over due to its smaller bottom surface area. And although smaller instruments may allow more movement between viewing angles, they cannot be stabilized in multiple angles without additional support. As a result, a way to stabilize test and measurements for versatile use in multiple positions is needed.

Embodiments of the disclosure in technology provide a solution to the stated problems and address shortcomings in the prior art.

BRIEF DESCRIPTION OF DRAWINGS

FIG. 14A is a side view of the stand with a test and measurement instrument and battery pack installed in the third position of use, according to embodiments of the disclosure. in which

DETAILED DESCRIPTION

As described above, many test and measurement instruments have been improved to be smaller, flatter, and lighter than previous models, but such instruments are prone to tipping over on benchtops and are generally not self-stabilizing in a way that permits use in more than one position. Embodiments according to the disclosure include a stand for such test and measurement instruments, providing stability and versatility for use in multiple positions.

Figure 1:
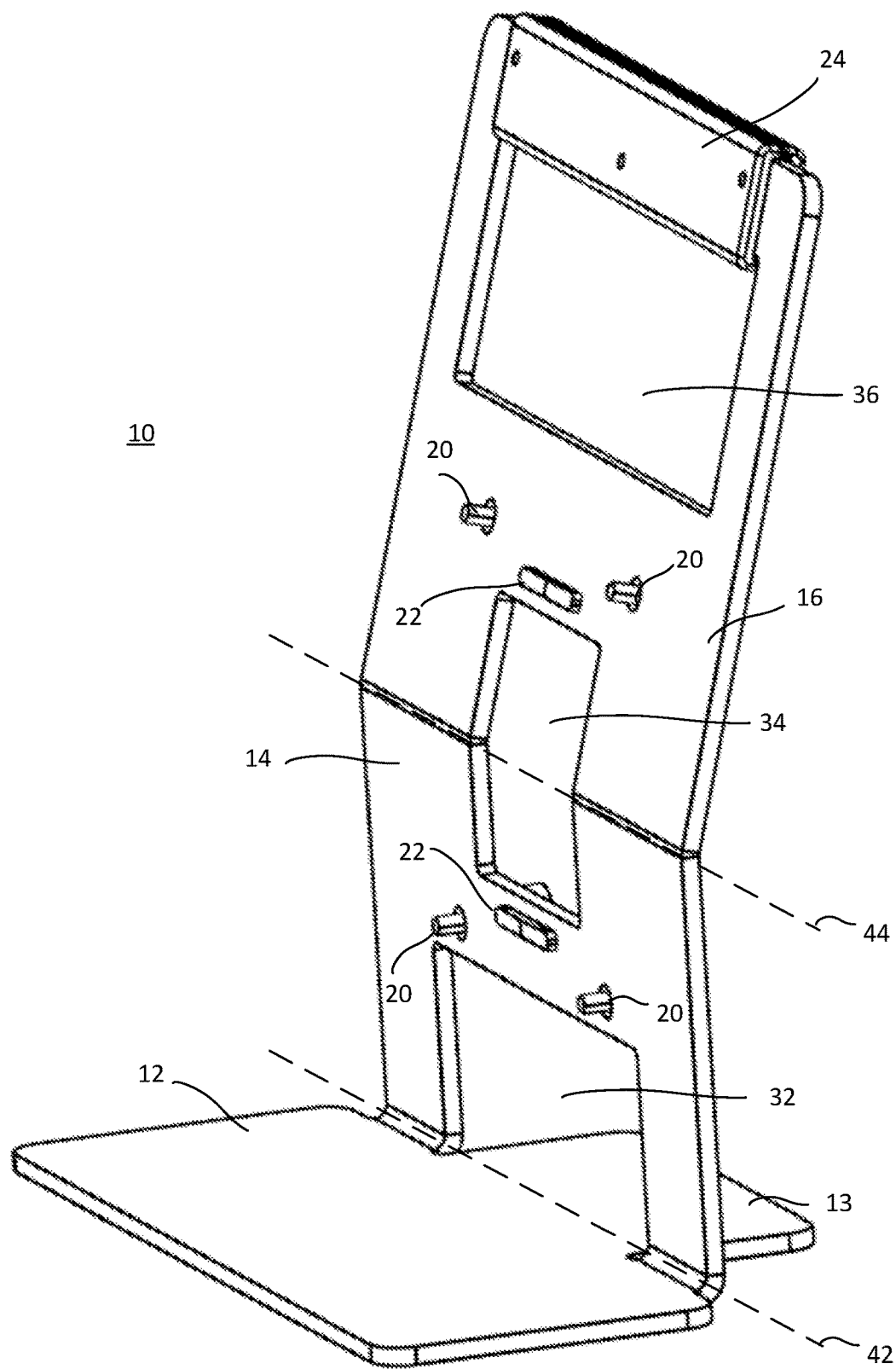
FIG. 1 is a perspective view of a stand for a test and measurement instrument, according to embodiments of the disclosure.

As illustrated in FIGS. 1-4, a stand 10 is constructed with three primary portions: a bottom plate 12 with a back flange 13 that, in some orientations, may rest on a benchtop or other substantially flat surface, a middle plate 14 extending orthogonally from the bottom plate 12, and a top plate 16 extending at an angle from the middle plate 14. In some embodiments, the top plate 16 is offset to lay back at a 15-degree angle from the plane of the middle plate 14, but in other embodiments the top plate 16 may be offset from the middle plate by a different amount, for example from 7 to 25 degrees. Additional features of the illustrated stand 10 are also illustrated in FIG. 1, such as mounting screws 20, a keying index 22, and a handle 24. When the stand 10 is in use, a user may utilize the keying index 22 to line up the instrument in a desired position of use, and the user may then use the mounting screws 20 to secure the instrument to the stand 10. The instrument may be secured to the stand 10 at various positions, which results in the instrument having multiple viewing angles, as described in further detail below. When mounted to the instrument, the stand 10 provides stability to the instrument while remaining relatively small and taking up minimal space on work surfaces. The back flange 13, being co-planar with the bottom plate 12, also remain flat to a work surface according to embodiments, allowing space above the back flange 13 to be used as a base for other equipment, such as a power brick. Additionally, once the instrument is secured to the stand 10, the user may take advantage of the handle 24 to easily move the stand 10 and instrument to desired locations.

Figure 2:
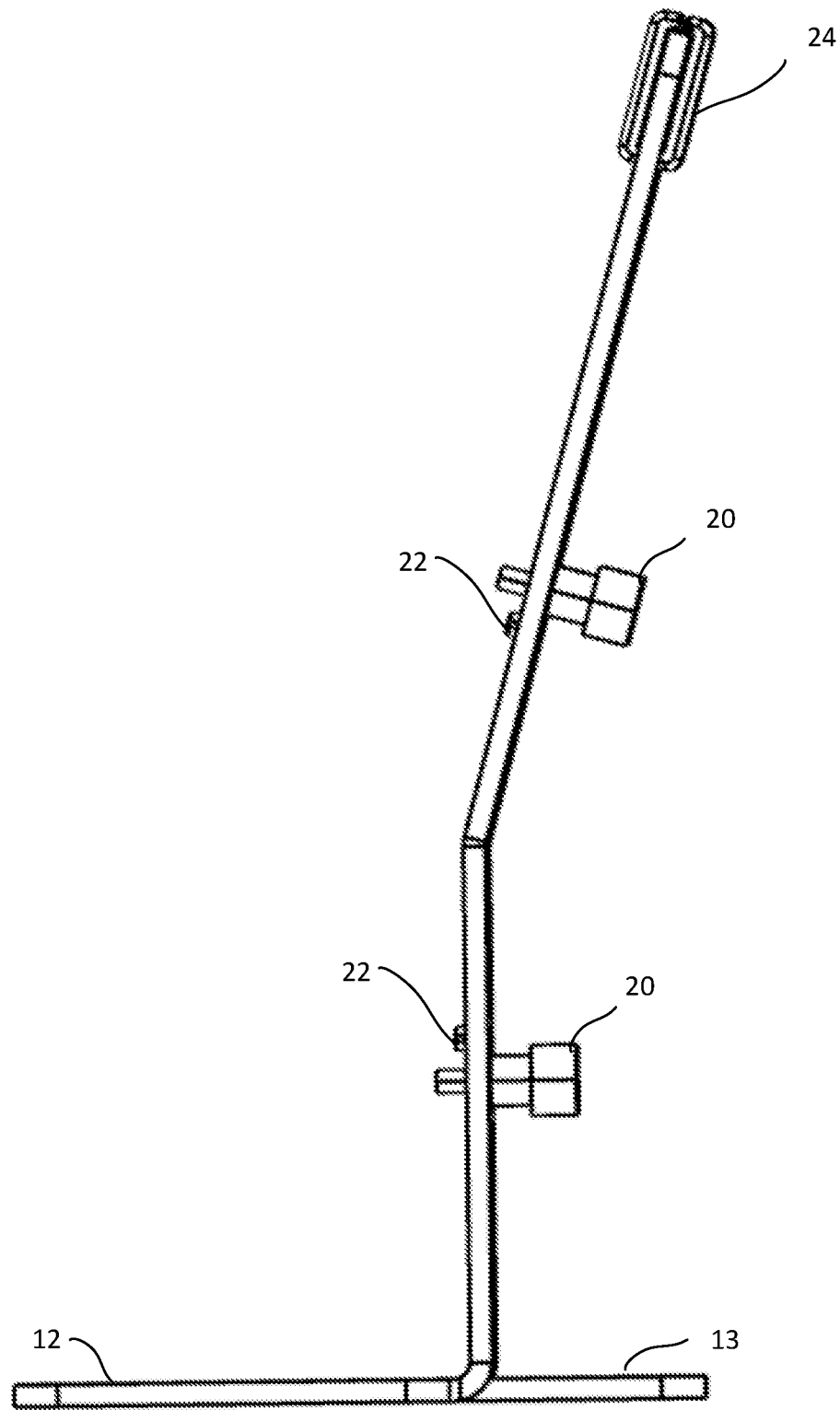
FIG. 2 is a side view of the stand of FIG. 1, according to embodiments of the disclosure.
Figure 3:
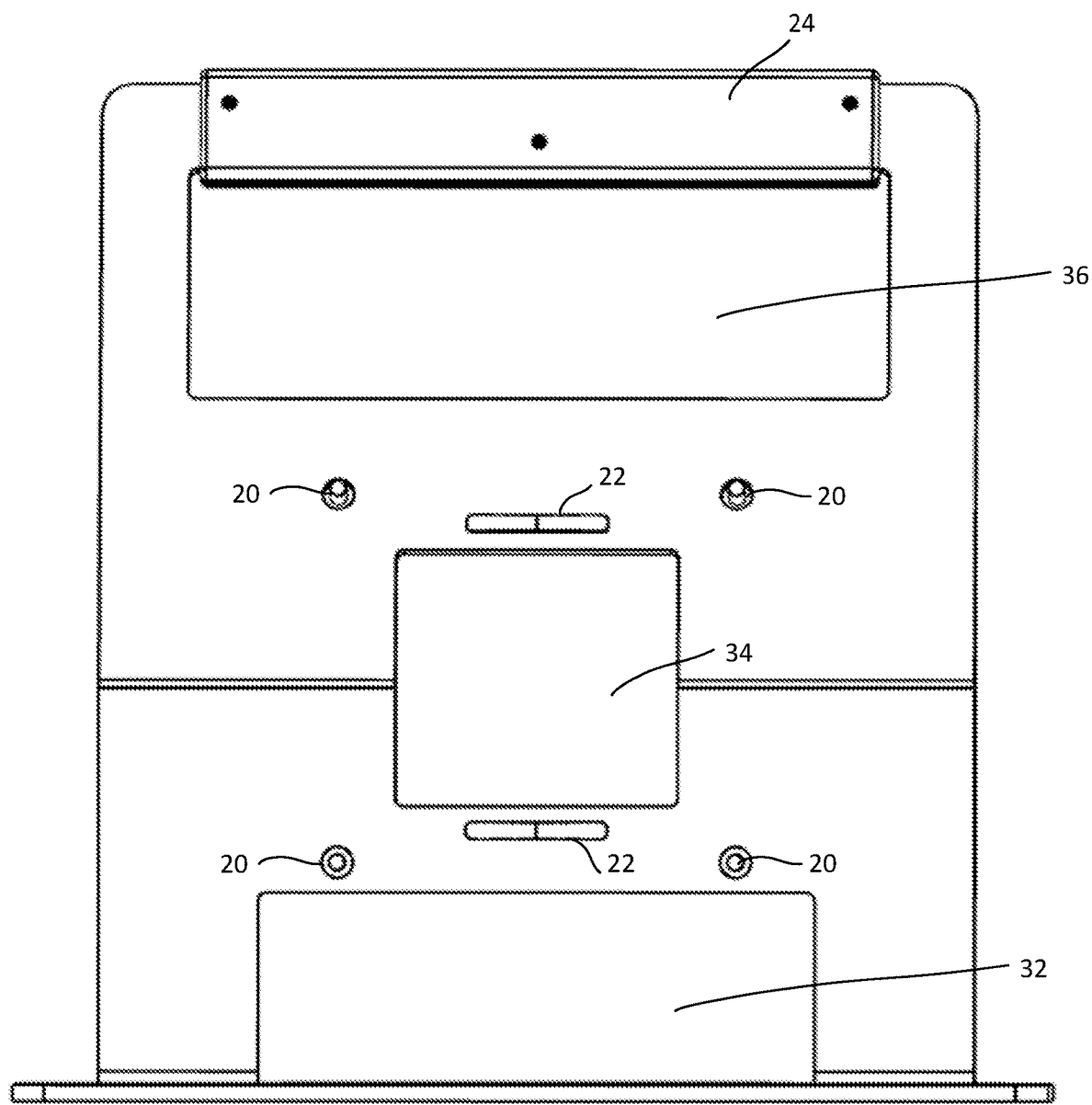
FIG. 3 is a front view of the stand of FIG. 1 detailing its features, according to embodiments of the disclosure.
Figure 4:
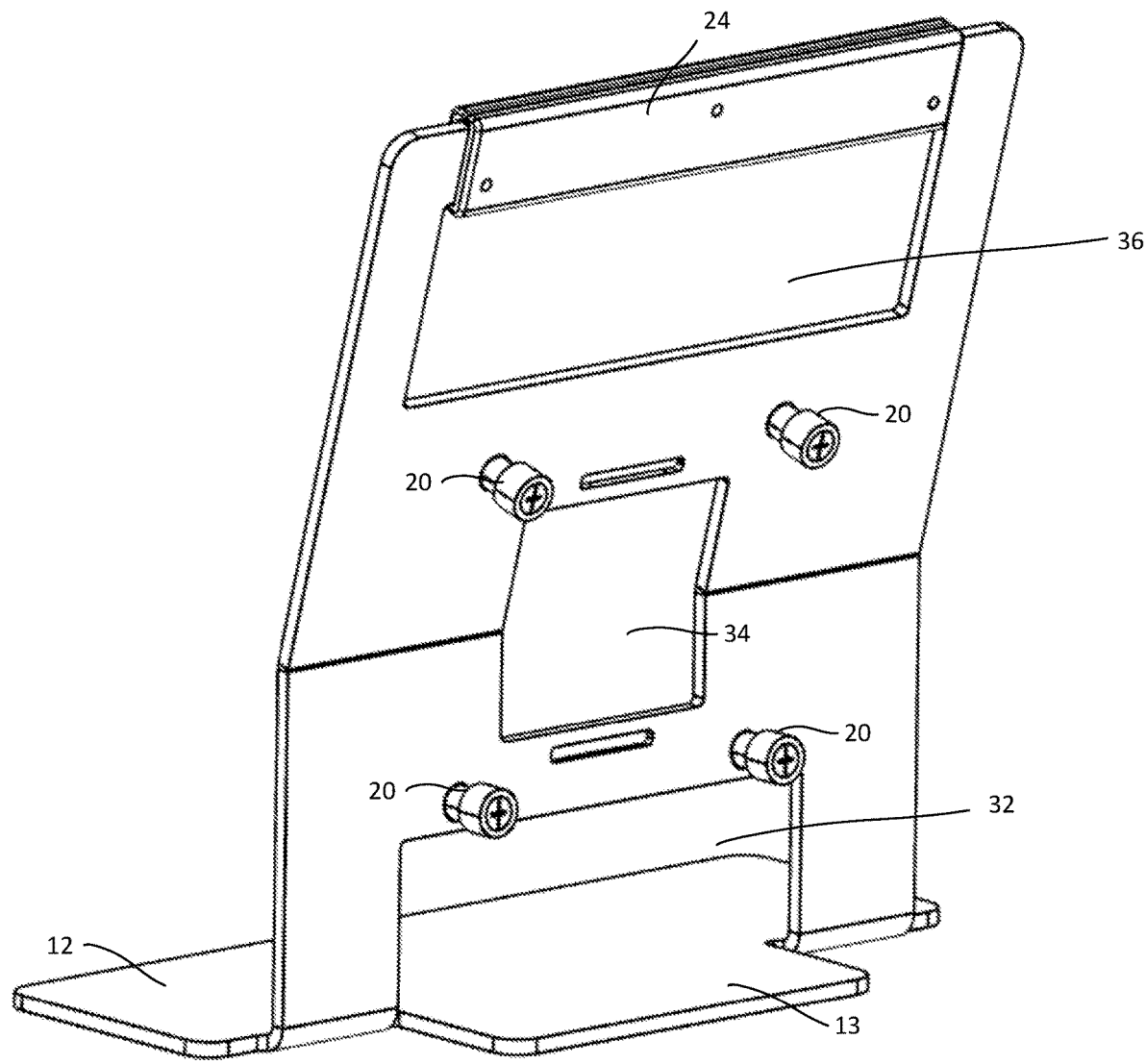
FIG. 4 is a rear perspective view of the stand of FIG. 1 detailing its features, according to embodiments of the disclosure.

The mounting screws 20, keying index 22, and handle 24 are depicted in greater detail in FIGS. 2-4. In embodiments, the mounting screws 20 are Video Electronics Standards Association (VESA) screws compatible with standard VESA mounting systems. The mounting screws 20 and their associated holes through the stand 10 are spaced and oriented according to the VESA standards. In this way, the stand 10 is structured to interface with instruments and other devices having matching receiver holes in a standard VESA spacing. Also, in embodiments, the projecting keying index 22 is structured to assist in securing the stand 10 to an instrument by aligning the instrument in a proper mating position for screwing the mounting screws 20 to the instrument. The keying index 22 may be formed of a material, such as plastic or metal, extended toward a mounting surface of the instrument from either the middle plate 14, or top plate 16, or both. The material making up the keying index 22 is shaped to fit inside a complementarily shaped recess in the mounting surface of the instrument. When used in cooperation, when a user wishes to mount an instrument to the stand 10, the user may insert the keying index 22 into the recesses of the mounting surface of the instrument, and the instrument will be properly aligned on the stand 10 to be secured by the mounting screws 20. The mounting screws 20 are then screwed into receiver holes in the instrument, fully securing the instrument to the stand 10. As shown in FIGS. 5-6 and 9-12, the mounting surface of the instrument may be the rear surface of the instrument.

Furthermore, as depicted in FIGS. 2-4, the stand 10 includes a handle 24. In embodiments, the handle 24 may constructed by creating a rectangular cutout to form aperture 36 in the top plate 16 and surrounding the top edge of the top plate 16 with a soft, grip-affording material. The material used to create the handle 24 may be rubber, another polymer, or any other suitable material for providing comfort and grip for a user. In one embodiment the handle 24 is formed from two pieces of material joined together with fasteners through the body of the stand 10.

FIGS. 1, 3, and 4 also illustrate that embodiments of the stand include multiple apertures and bend lines. A bottom aperture 32 is disposed where the middle plate 14 meets the bottom plate 12 and back flange 13. As discussed in further detail below, in some embodiments, the bottom aperture 32 may be created by making a cut in the middle plate 14 and bending the cut material along bend line 42 to become the back flange 13. A middle aperture 34 exists on either side of a bend line 44 where the middle plate 14 and top plate 16 meet, creating empty space on both the middle plate 14 and the top plate 16. Finally, the top aperture 36 exists on the top plate 16, creating the space to allow for the handle 24. Including any of the middle aperture 34 or top aperture 36 reduces the amount of material used in producing the stand 10. Of course, apertures 32, 34, 36 may be sized and shaped differently than illustrated in these figures according to implementation details. In other embodiments, not all apertures need be present within the stand 10.

Figure 5:
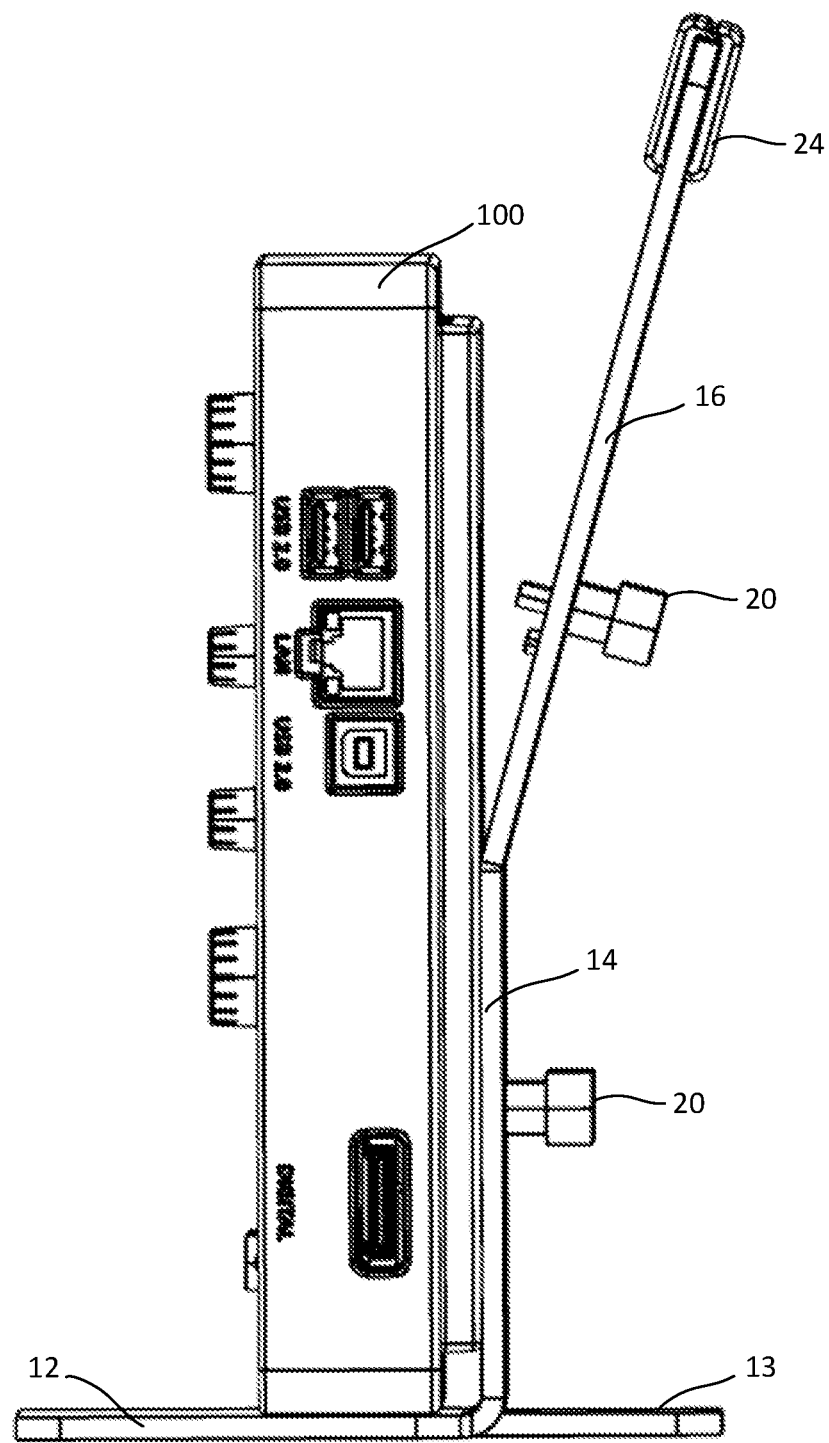
FIG. 5 is a side view of the stand of FIG. 1 with a test and measurement instrument installed in a first position of use, according to embodiments of the disclosure.
Figure 6:
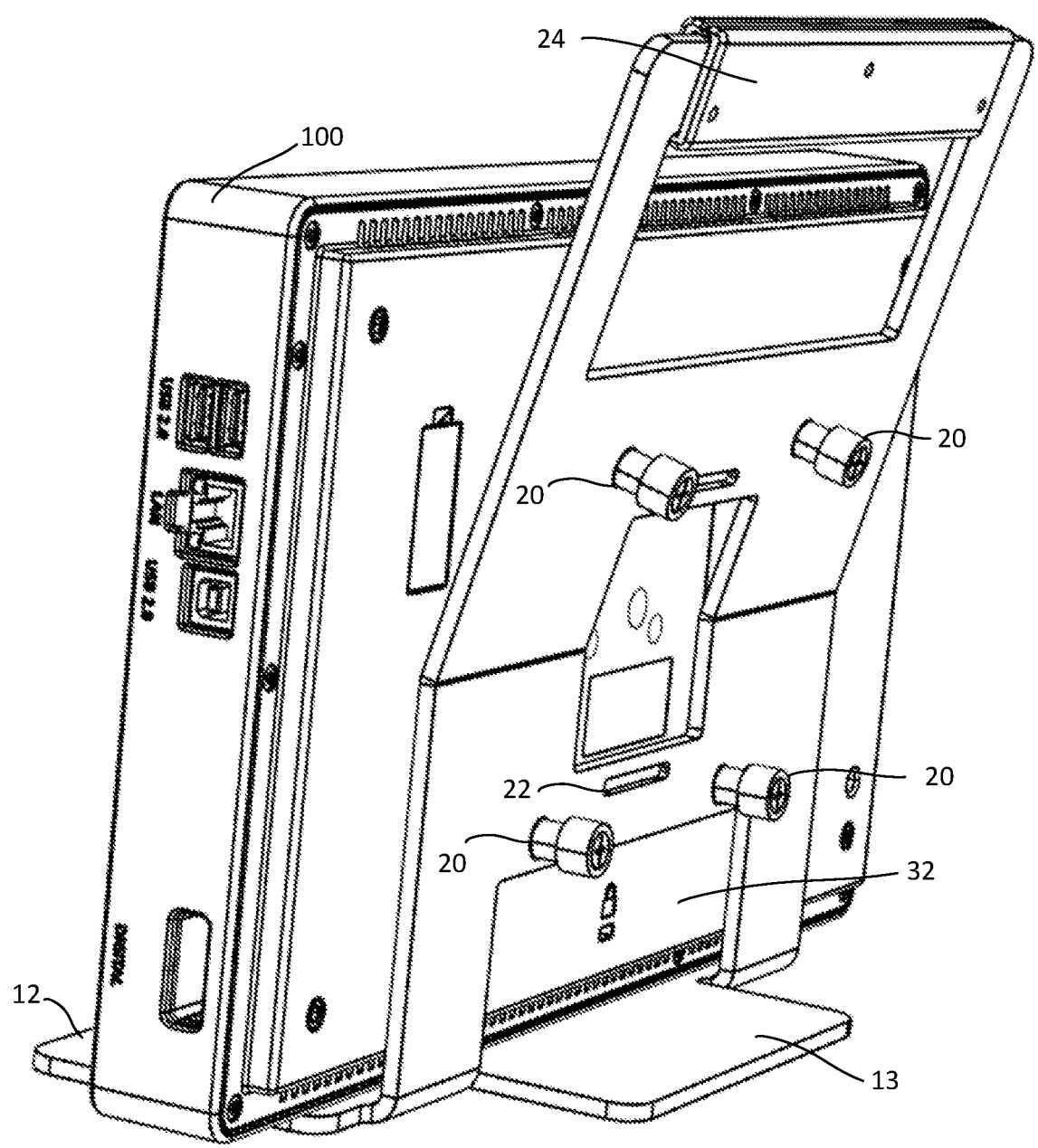
FIG. 6 is a rear perspective view of the stand and instrument of FIG. 5, according to embodiments of the disclosure.

The stand 10 allows a user to secure and stabilize an instrument in multiple positions of use. FIG. 5 illustrates a first position of use, in which an instrument 100 is secured to the stand 10 in an upright position, approximately 90 degrees from a horizontal plane or aligned with a vertical plane. In this position, the stand 10 is kept upright with the bottom plate 12 sitting flush against a surface, such as a benchtop or table. The instrument 100 sits with its bottom edge flush against the bottom plate 12, and the instrument 100 is fastened to the middle plate 14 with the bottom set of mounting screws 20. As illustrated, securing the instrument in this first position involves only the mounting screws 20 housed on the middle plate 14, leaving the mounting screws 20 housed on the top plate 16 unused. The mounting screws 20 housed on the top plate 16 may be used for additional positions, as described in more detail below. The mounting screws 20 may be captured screws, according to embodiments of the disclosure. In some embodiments, the stand 10 may include holes without captured screws, spaced in a VESA-compatible pattern, through which separate screws may be used to secure the instrument 100 to the stand 10. Similarly, as shown in FIG. 6, the keying index 22 on the middle plate 14 is inserted into the rear surface of the instrument 100. In this first position of use, the combination of stand 10 and instrument 100 allow for stable, vertically upright use of the instrument 100 without taking up significant space on a work surface. Consequently, the stand 10 addresses the stability and tipping concerns associated with flatter form factor instruments without taking away from the value of a flatter form factor. Tipping of the stand 10 is prevented through the structure and position of the bottom plate 12 and back flange 13, which extend the lower horizontal surface of the stand 10 well beyond the available lower horizontal surface of the instrument 100 itself, providing additional stability over using just the instrument without the stand 10. In embodiments, a wall-powered test and measurement instrument 100 may be secured to the stand 10 to maintain its upright position on a lab benchtop, then subsequently moved to different locations on the benchtop or within the lab. And, as mentioned above, the back flange 13 also provides a base on which a power adaptor or other component used in operation of the instrument 100 may sit.

Embodiments of the stand 10 may be constructed using a single piece of metal. With reference back to FIG. 1, to create the stand 10 according to such embodiments, a shape following the edges of the bottom plate 12, the middle plate 14, and the top plate 16 is cut from a single piece of metal. Then, a shape following the form of the back flange 13 is cut from the middle plate, and the metal is bent approximately 90 degrees along bend line 42, leaving the middle plate 14 and top plate 16 extending orthogonally upward from the bottom plate 12 and back flange 13, and creating aperture 32 in the middle plate 14. Two additional cuts may be made to form apertures 34 and 36 in the middle plate 14 and top plate 16, respectively. The metal plate is then bent along bend line 44 to create the layback angle of the top plate 16. In embodiments, the metal is bent at an angle of 15 degrees, but other embodiments may utilize a bend of any angle between 7 and 25 degrees. Of course, these fabrication steps may be performed in different orders than just described.

Figure 7:
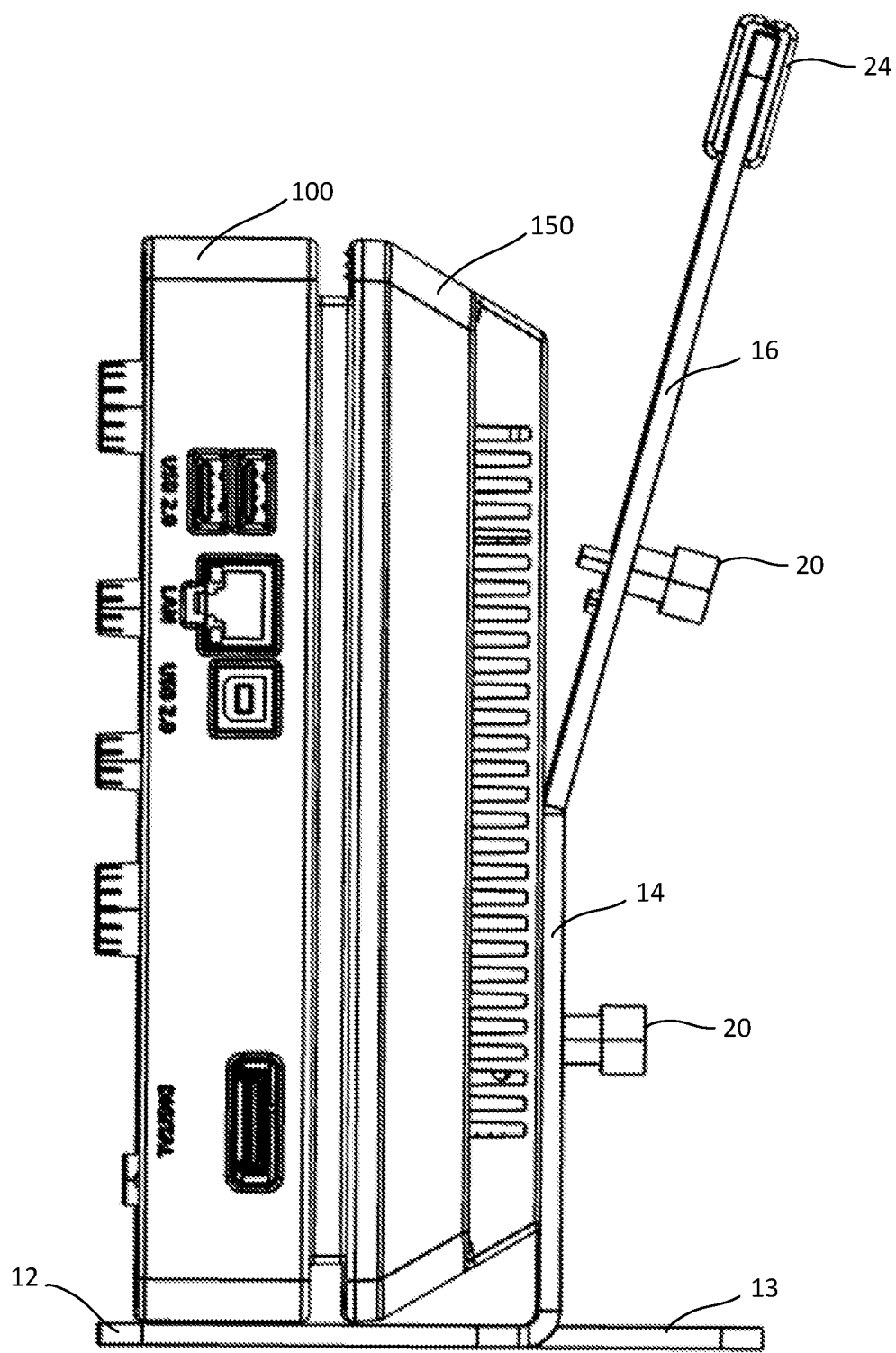
FIG. 7 is a side view of the stand with a test and measurement instrument and a battery pack installed in the first position of use, according to embodiments of the disclosure.
Figure 8:
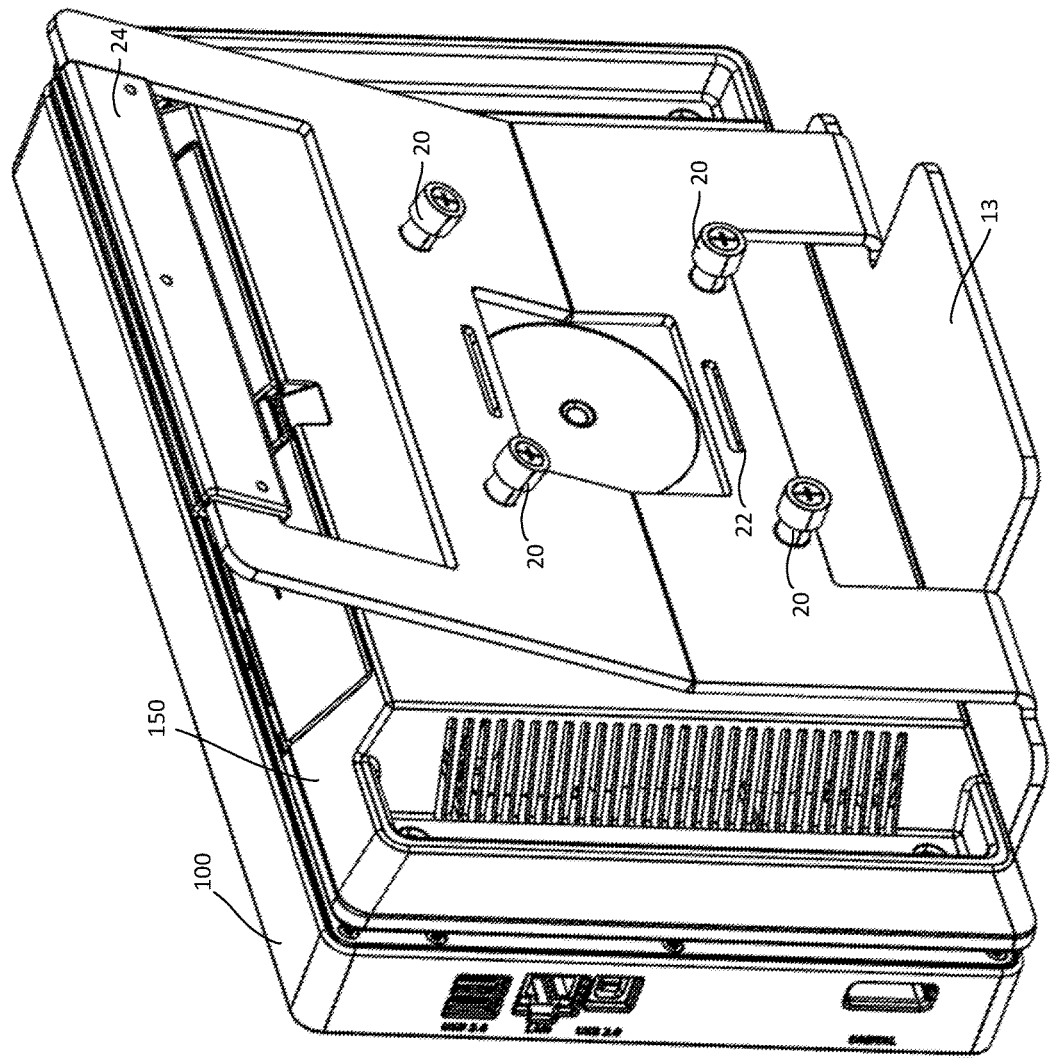
FIG. 8 is a rear perspective view of the stand, instrument, and battery pack of FIG. 7, according to embodiments of the disclosure.

To accommodate battery-powered test and measurement instruments, the stand 10 is also designed to be compatible with instruments utilizing removable battery packs. This feature is illustrated in FIG. 7, which provides a side view of an instrument 100 including a battery pack 150 secured to the stand 10 in the first position of use of the instrument. As illustrated, the instrument 100 including the battery pack 150 is secured to the stand 10 in the same fashion as was illustrated in FIG. 5 without the battery pack attached. The battery pack 150 is separately attached to the instrument 100 using components other than those in conjunction with the stand 10. Further details are illustrated in FIG. 8, which provides a rear perspective view of the instrument 100 including the battery pack 150 secured to the stand 10 in this first position of use. The keying index 22 and mounting screws 20 housed on the middle plate 14 still function to align the instrument 100 and screw into receiver holes on a rear surface of the battery pack 150. These receiver holes, similar to those on the instrument 100, are arranged according to VESA standards on the battery pack 150. Additionally, the instrument 100 remains flush against the bottom plate 12, while the battery pack 150 is mounted flush to the middle plate 14, keeping the instrument 100 upright and stable. As such, regardless of whether a user primarily uses a wall-powered instrument, a battery-powered instrument, or switches between the two, the stand 10 accommodates all needs without changing the user experience.

Figure 9:
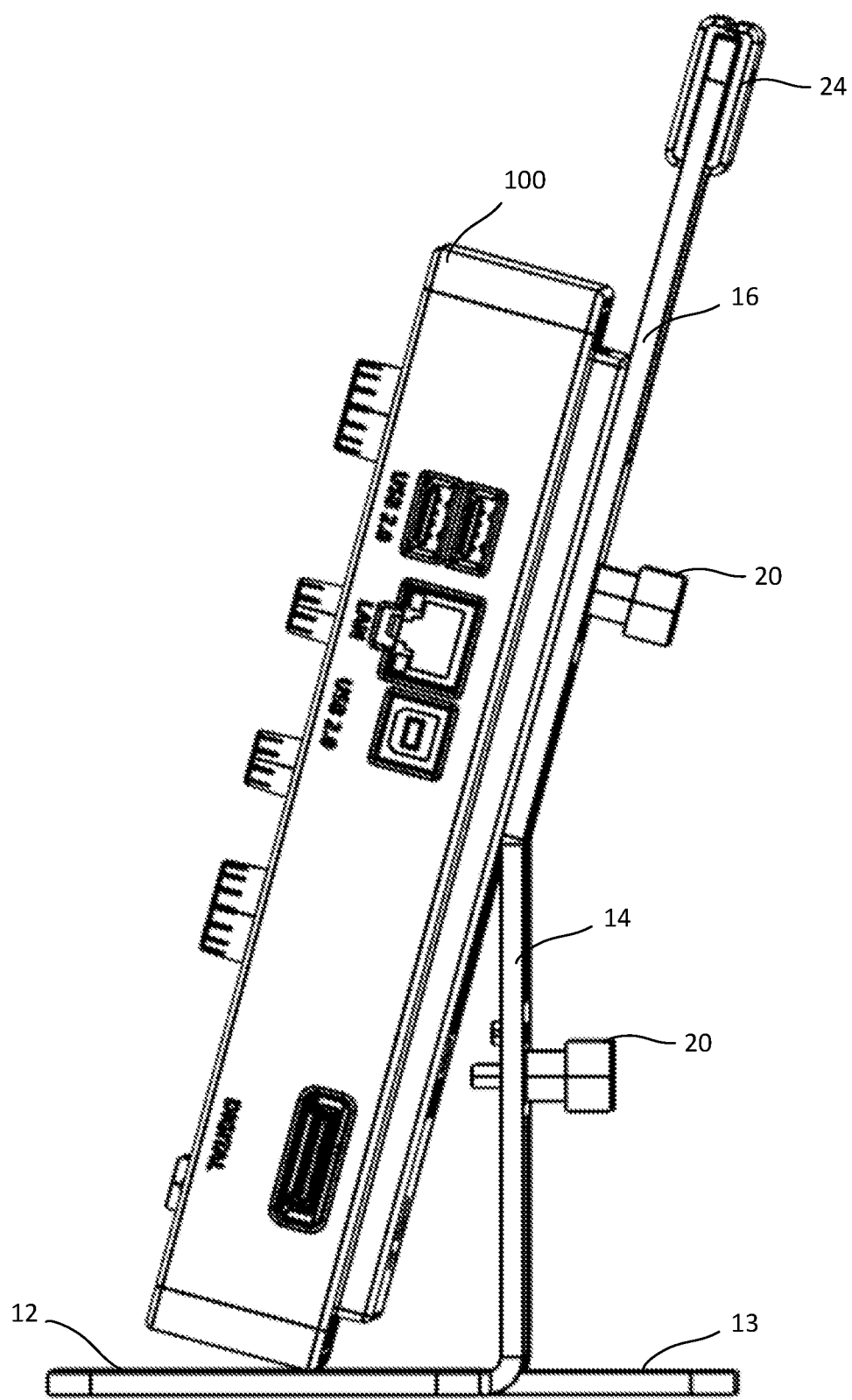
FIG. 9 is a side view of the stand with a test and measurement installed in a second position of use, according to embodiments of the disclosure.
Figure 10:
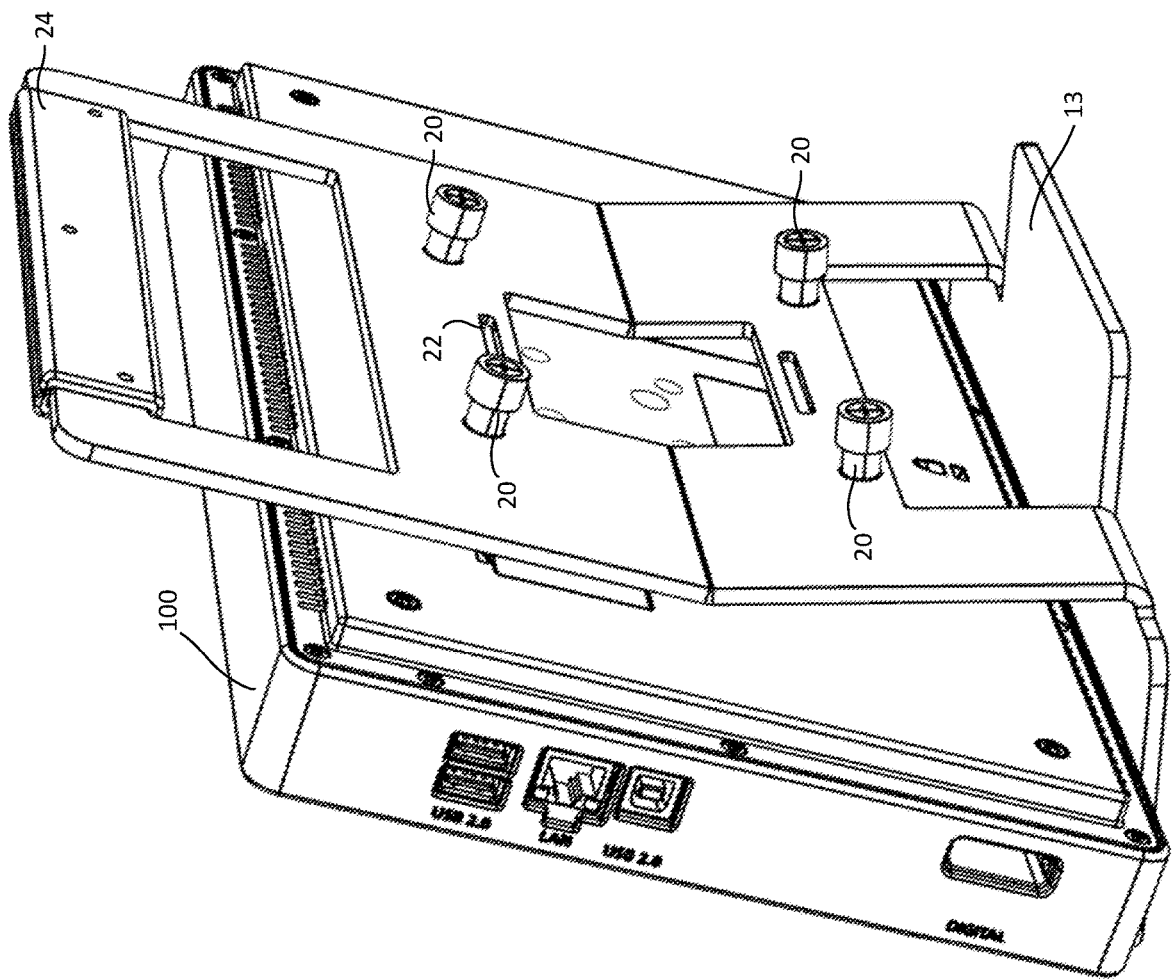
FIG. 10 is a rear perspective view of the stand and instrument of FIG. 9, according to embodiments of the disclosure.

In addition to accommodating instruments of varying power sources in the first position, the stand 10 is also designed to accommodate several positions of use. A second operating position is depicted in FIG. 9, which shows a side view of the instrument 100 secured to the stand 10. In this second position, the instrument 100 is tilted back from vertical at the same angle the top plate 16 extends from the middle plate 14. The instrument 100 sits with a rear edge on or near the bottom plate 12, and the keying index 22 and mounting screws 20 housed on the top plate 16 assist in securing the instrument 100 in this tilted position. The bottom plate 12 and back flange 13 remain flush with a flat surface, such as a benchtop. An additional, rear perspective view of the connection between the instrument 100 and the stand 10 in this second position is shown in FIG. 10. As shown in FIGS. 9 and 10, the mounting screws 20 and keying index 22 housed on the middle plate 14 are left unused in this second position. In embodiments, the top plate 16 is angled 15-degrees from vertical, and thus the instrument 100 may be viewed at a 15-degree angle from vertical in the second position. If the top plate 16 is angled from the middle plate 14 at an other-than-15 degree angle, as described above, the instrument is viewed at the same angle at which the middle plate meets the top plate. Such a viewing angle may provide a user a more practical or comfortable option for use on surfaces below eye level compared to a vertical viewing position, for instance. And, regardless of position of use, the fact that the instrument 100 is secured to the stand 10, which can be carried and moved by the handle 24, allows the instrument 100 to be moved without losing the desired angle or position of use. Additionally, in the second position of use, the instrument 100 spatially remains within the footprint of the stand 10. Put differently, the instrument 100 does not take up any extra space on a work surface when used in the second position as compared to the first position.

Figure 11A:
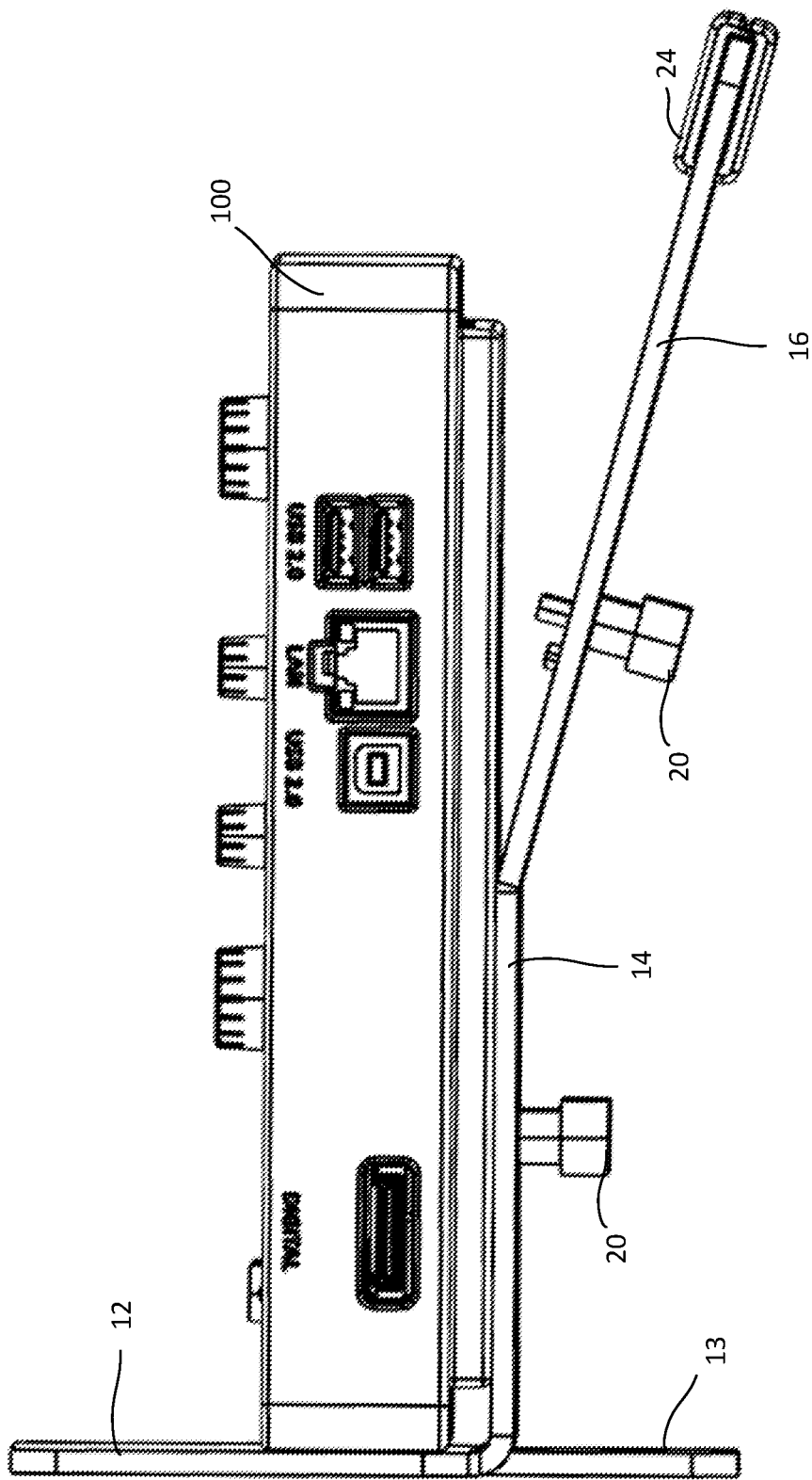
FIG. 11A is a side view of the stand with a test and measurement instrument installed in a third position of use, according to embodiments of the disclosure.
Figure 11B:
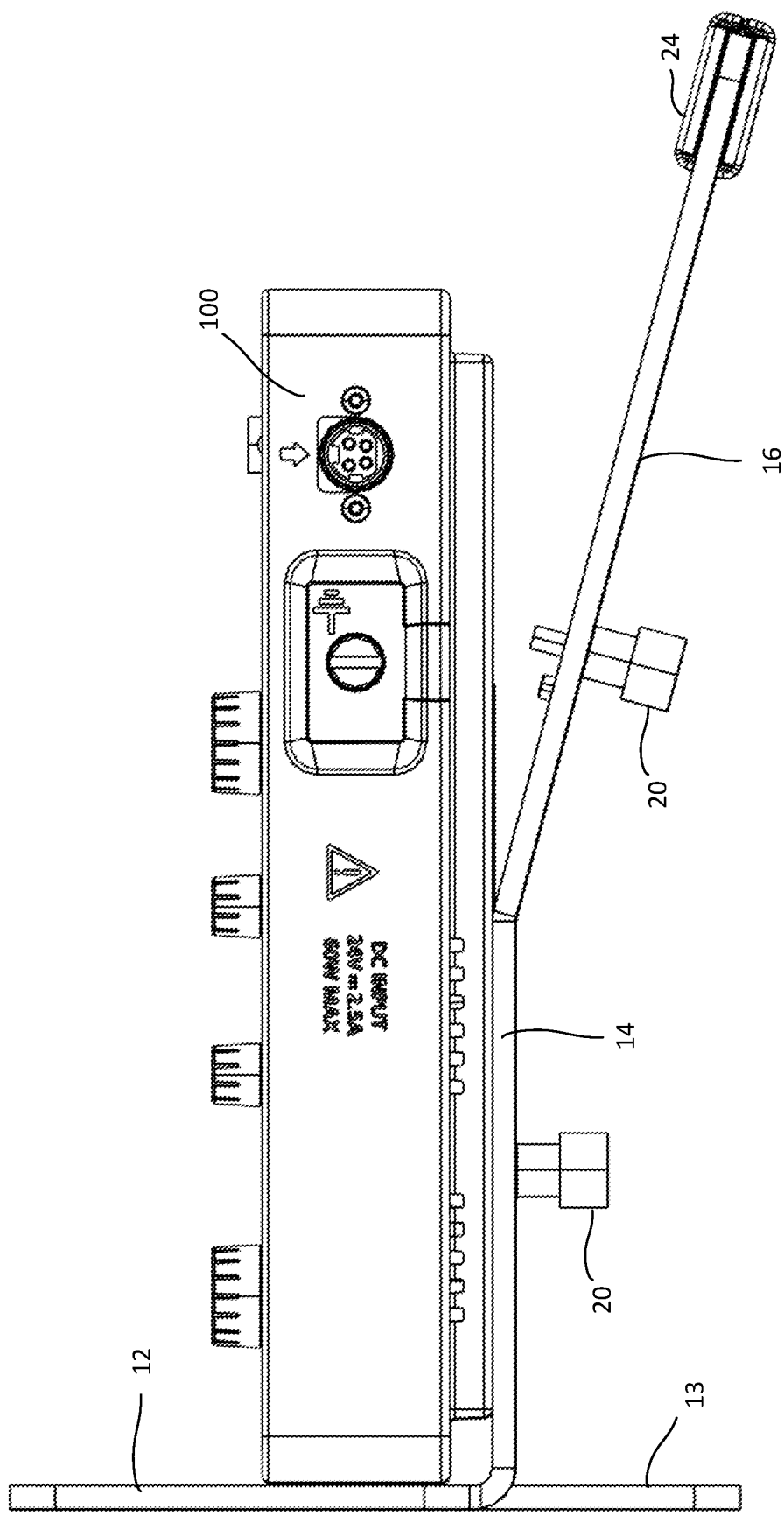
FIG. 11B is a side view of the stand with a test and measurement instrument installed in a third position of use in which the instrument is rotated from the orientation illustrated in FIG. 11A, according to embodiments of the disclosure.

A third position of use, depicted in FIGS. 11A and 11B, allows a user to place the instrument 10 with the display at horizontal. In this position, the instrument 100 is secured to the stand 10 using the keying index 22 and mounting screws 20 housed on the middle plate 14. The keying index 22 and mounting screws 20 housed on the top plate 16 are left unused, and the bottom surface of the instrument 100 sits flush with the bottom plate 12. As such, the instrument 100 in FIG. 11A is secured to the stand 10 in a similar fashion as the first, upright position depicted in FIG. 5. The instrument 100 in FIG. 11B is rotated 180 degrees from its position in FIG. 11A, but is mounted to the stand 10 in a similar fashion and position. In this third position, however, rather than the stand sitting upright with the bottom plate 12 flush to a flat surface, the stand 10 is rotated 90 degrees from upright and placed on a flat or otherwise compatible surface. The stand 10 is thus stabilized on the flat surface through points of contact along a rear edge of the back flange 13 and along an edge of the handle 24. Through this horizontal viewing angle, the stand 10 demonstrates versatility not available with traditional test and measurement instruments. The stand 10 may accommodate field scenarios, for example, where the instrument is most ideally placed on the ground and viewed from standing above. And, because the instrument 100 is secured to the stand 10 the same regardless of whether it is used upright or at horizontal, the instrument 100 may be easily switched between viewing angles with little to no effort from the user, simply by rotating the stand 10 and instrument 100 to this third position.

Figure 12A:
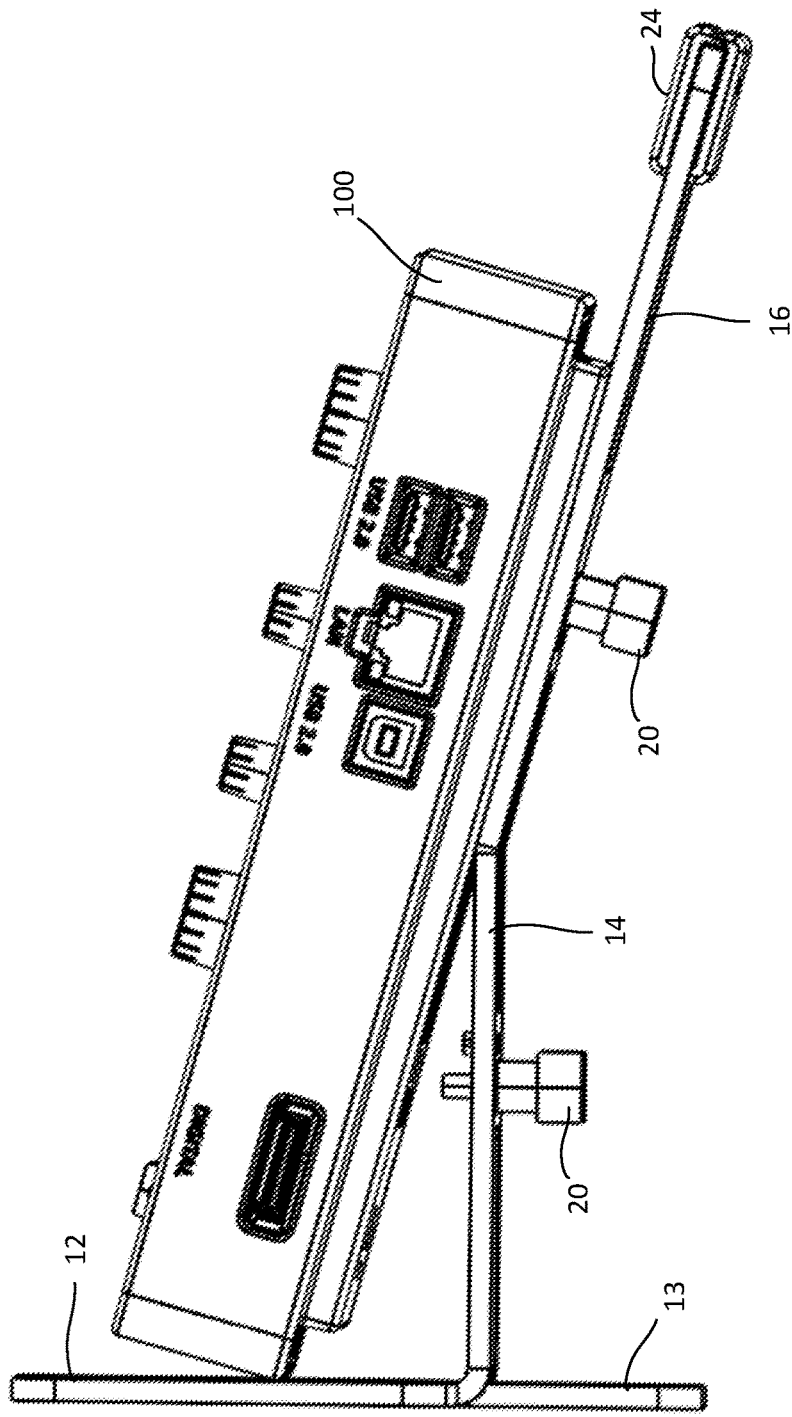
FIG. 12A is a side view of the stand with a test and measurement instrument installed in a fourth position of use, according to embodiments of the disclosure. in which the instrument is
Figure 12B:
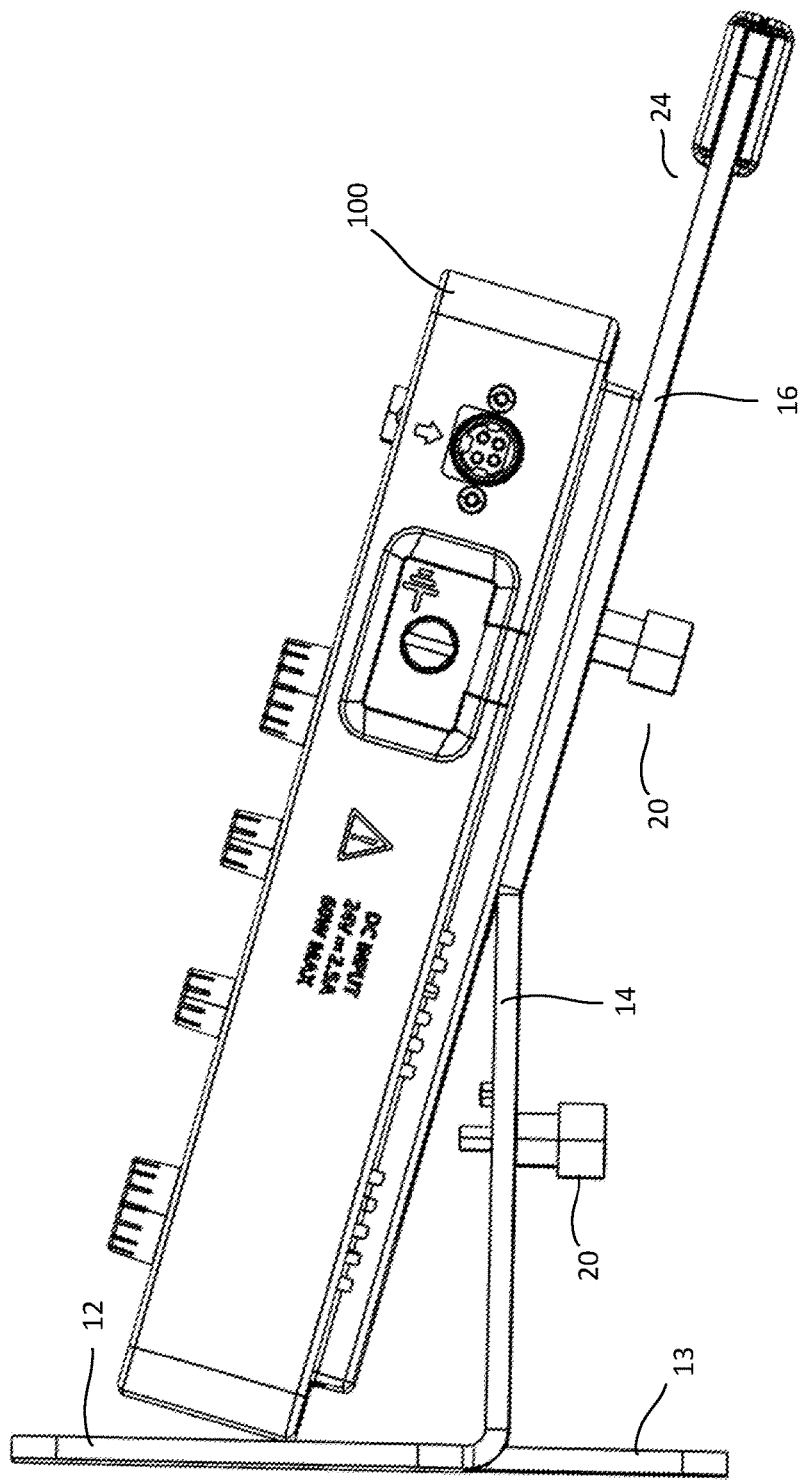
FIG. 12B is a side view of the stand with a test and measurement instrument installed in a fourth position of use in which the measurement is rotated from the orientation illustrated in FIG. 12A, according to embodiments of the disclosure.

In a fourth position of use, a user may place the instrument 10 with the display at an angle other than horizontal, with the stand rotated to the same or similar position as in position three. A side view of this fourth position is depicted in FIGS. 12A and 12B. In this position, as with position two, the instrument 100 is secured to the stand 10 using the keying index 22 and mounting screws 20 housed on the top plate 16. A bottom edge of the instrument 100 contacts the bottom plate 12 but, depending on the shape of the instrument, does not sit flush on the bottom plate 12. In this fourth position, the keying index 22 and mounting screws 20 housed on the middle plate 14 are left unused. In sum, the instrument 100 is secured to the stand 10 the same way it is secured when used in its second position, depicted in FIG. 9 and described above. But the stand 10 does not sit upright in this fourth position. Rather, it is tiled or rotated 90 degrees from upright, similar to the third position. Accordingly, the stand 10 is stabilized by contacting a flat surface at two locations: an edge of the back flange 13 and an edge of the handle 24. In this position, laying the stand 10 back to horizontal thus lays the instrument 100 back an additional angle from horizontal. Having an additional layback angle provides further versatility and accommodates a wider range of scenarios. In embodiments, the layback angle of the instrument 100 may be approximately 75 degrees. Or, if the top plate 16 is angled from the middle plate 14 at an other-than-15 degree angle, as described above, the instrument is viewed at an other-than-75 degree angle in this rotated, fourth position. The instrument 100 in FIG. 12B is rotated 180 degrees from its position in FIG. 12A, but is otherwise mounted in the same way as in FIG. 12A.

As previously described, the stand 10 may be used with instruments of varying power sources. FIGS. 7 and 8 depicted use of the stand 10 with an instrument 100 including a removable battery pack 150 in the first position of use without otherwise changing the user experience of securing the instrument 100 to the stand 10. The same is true for the second, third, and fourth positions of use, as illustrated in FIGS. 13, 14A, 14B, 15A, and 15B. Thus, all positions of use are available regardless of whether a user powers the instrument 100 via wall connection or via battery pack 150. This versatility is particularly beneficial for field settings, where work surfaces and heights may vary and wall connections may be limited. With the disclosed stand 10, a user may take an instrument 100 into the field with a battery pack 150 and take measurements not only without worrying about whether a power source will be available but also without worrying whether an appropriate surface will be available. And, with each position of use being quickly accessible through simple screws 20, or rotating the stand 10, a user may switch between positions with minimal effort, regardless of power source.

Figure 13:
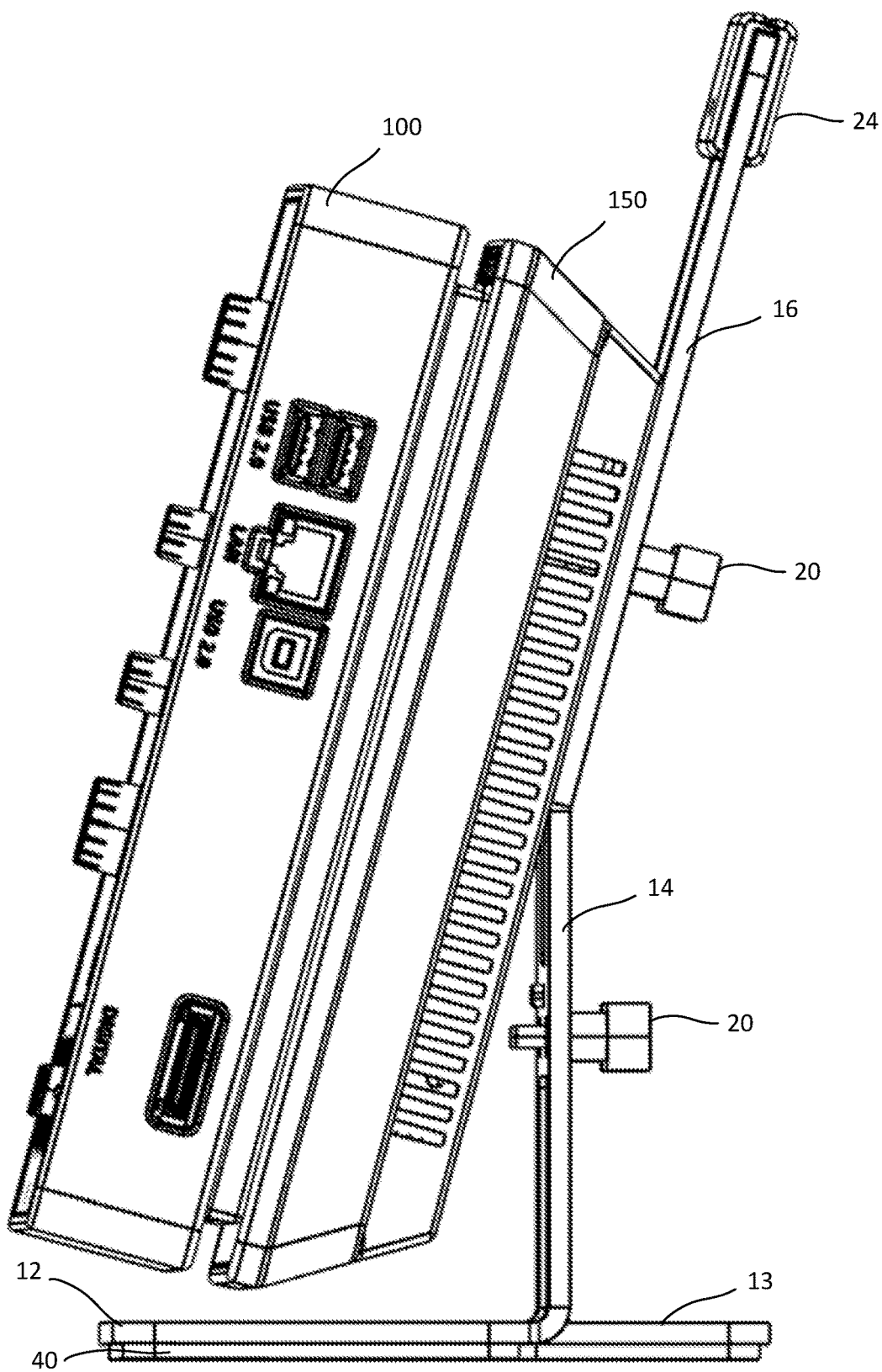
FIG. 13 is a side view of the stand with a test and measurement instrument and battery pack installed in the second position of use, according to embodiments of the disclosure.
Figure 14A:
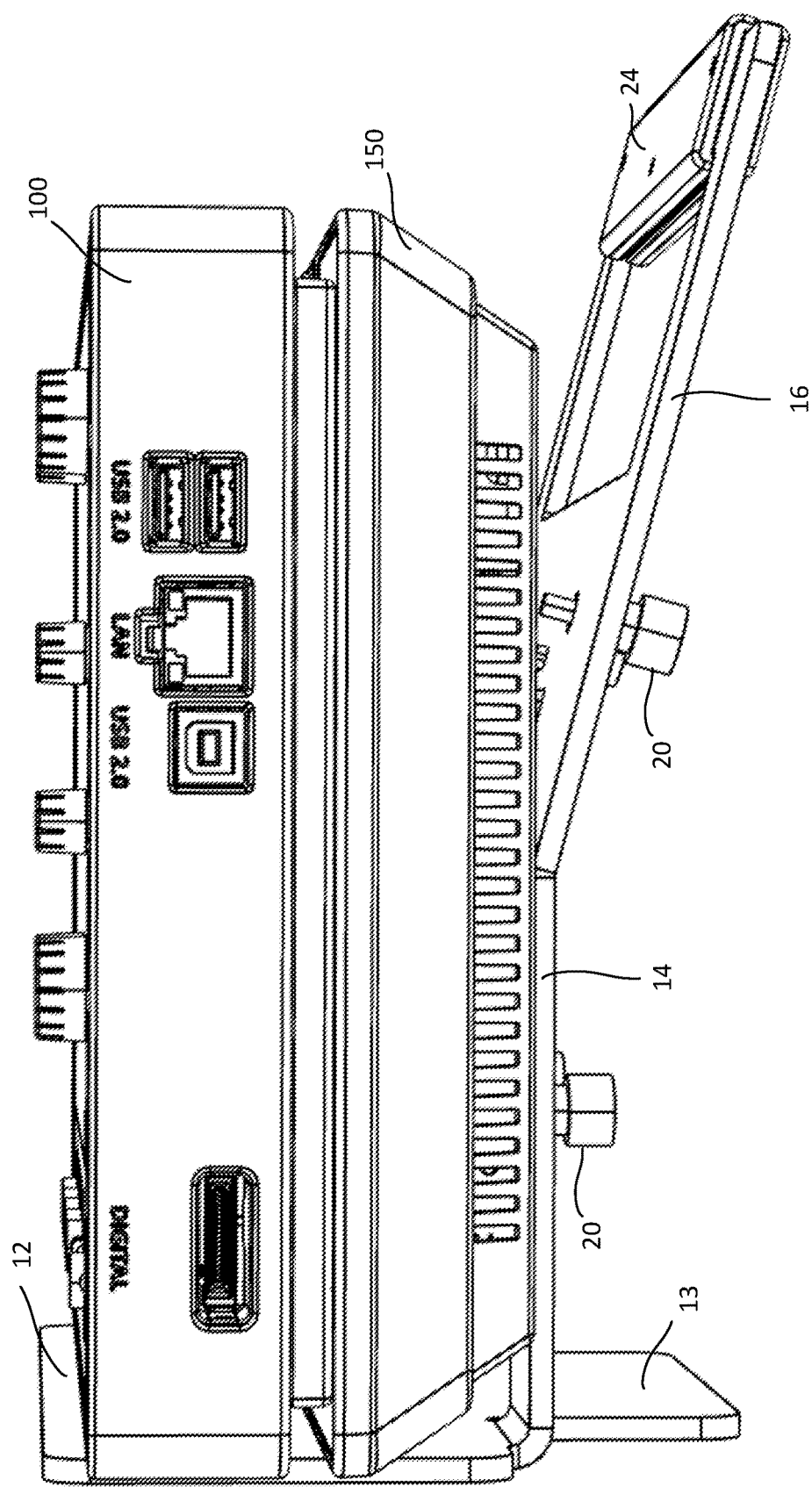
Figure 14B:
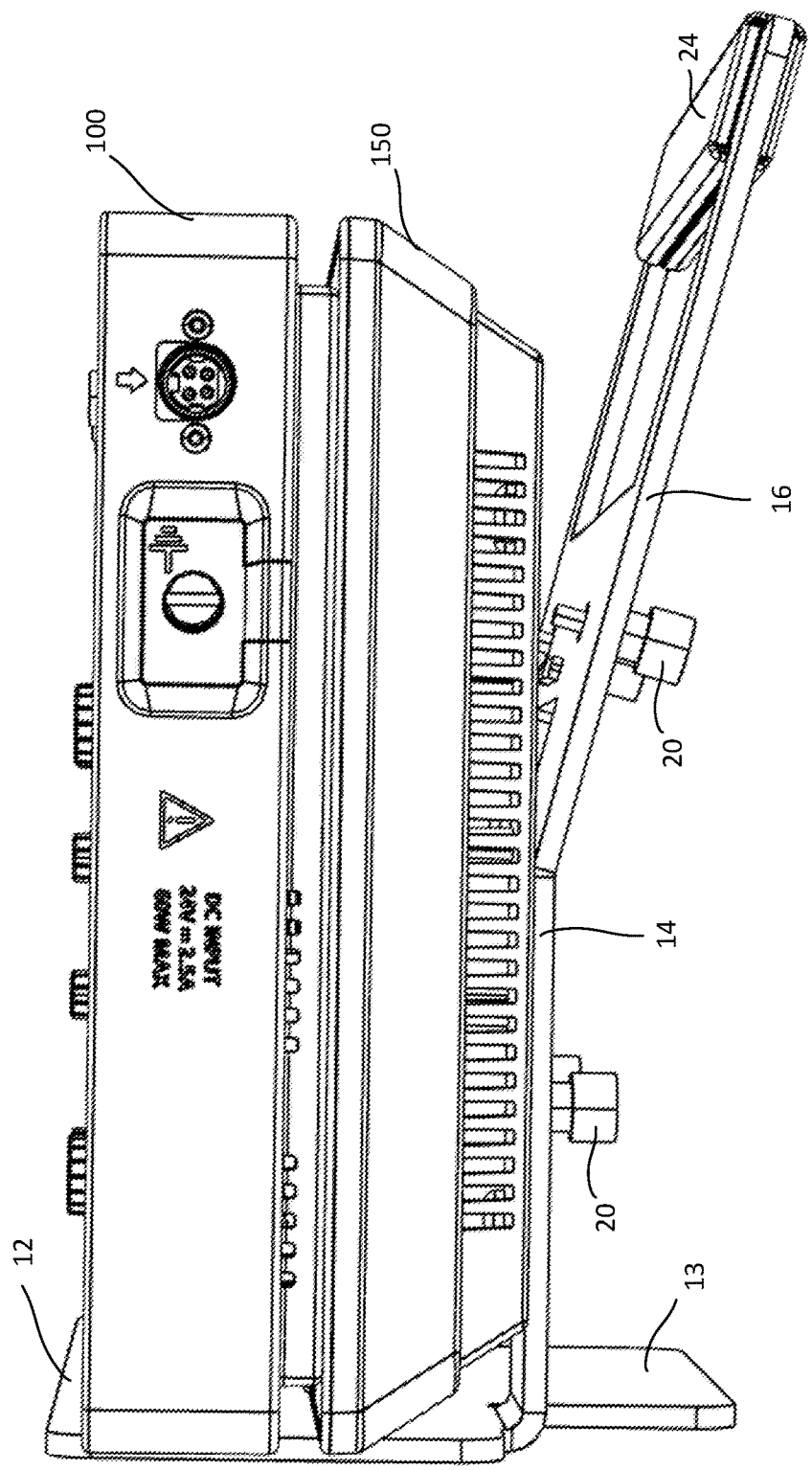
FIG. 14B is a side view of the stand with a test and measurement instrument and battery pack installed in the third position of use in which the measurement is rotated from the orientation illustrated in FIG. 14A, according to embodiments of the disclosure.
Figure 15A:
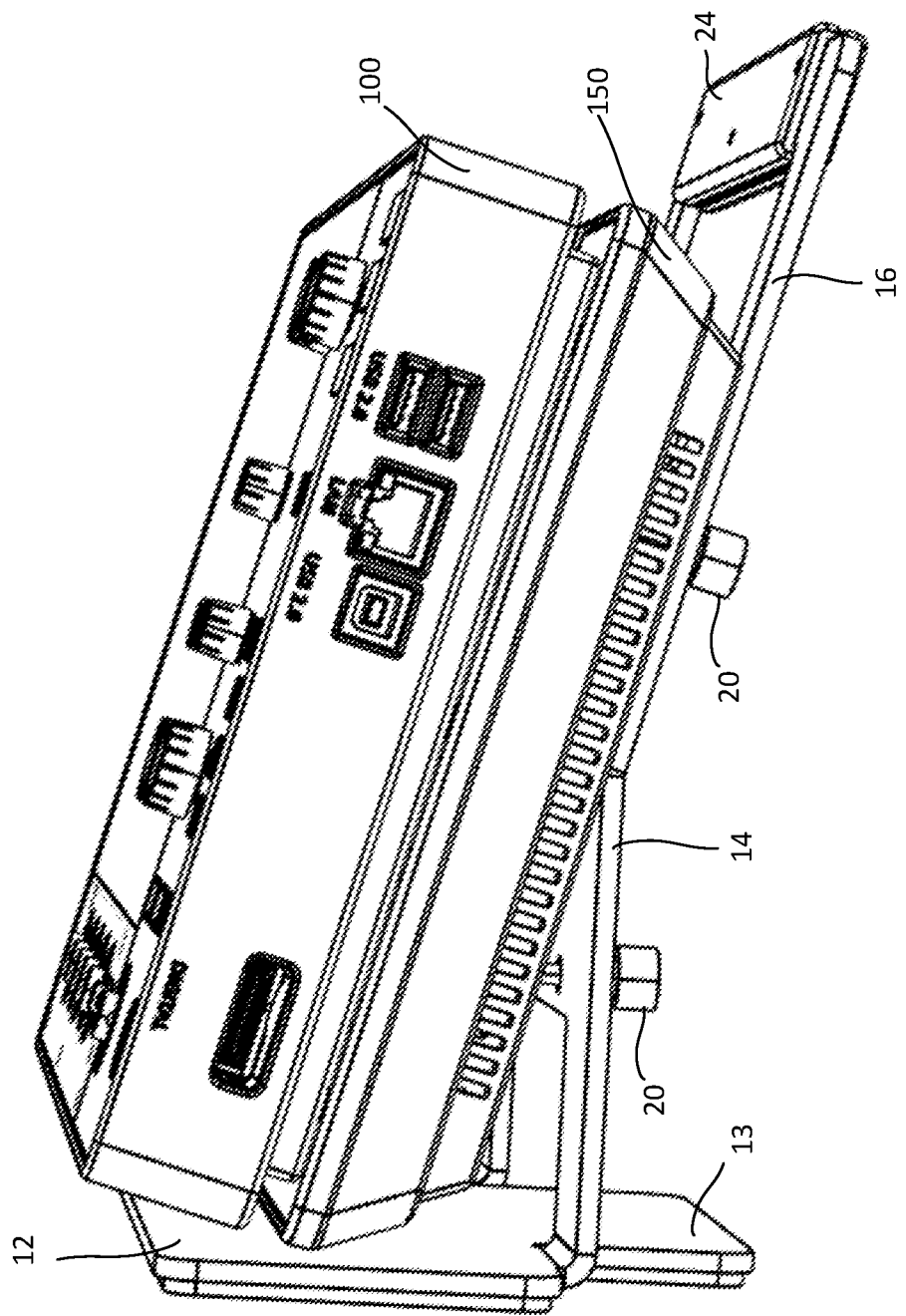
FIG. 15A is a side view of the stand with a test and measurement instrument and battery pack installed in the fourth position of use, according to embodiments of the disclosure.
Figure 15B:
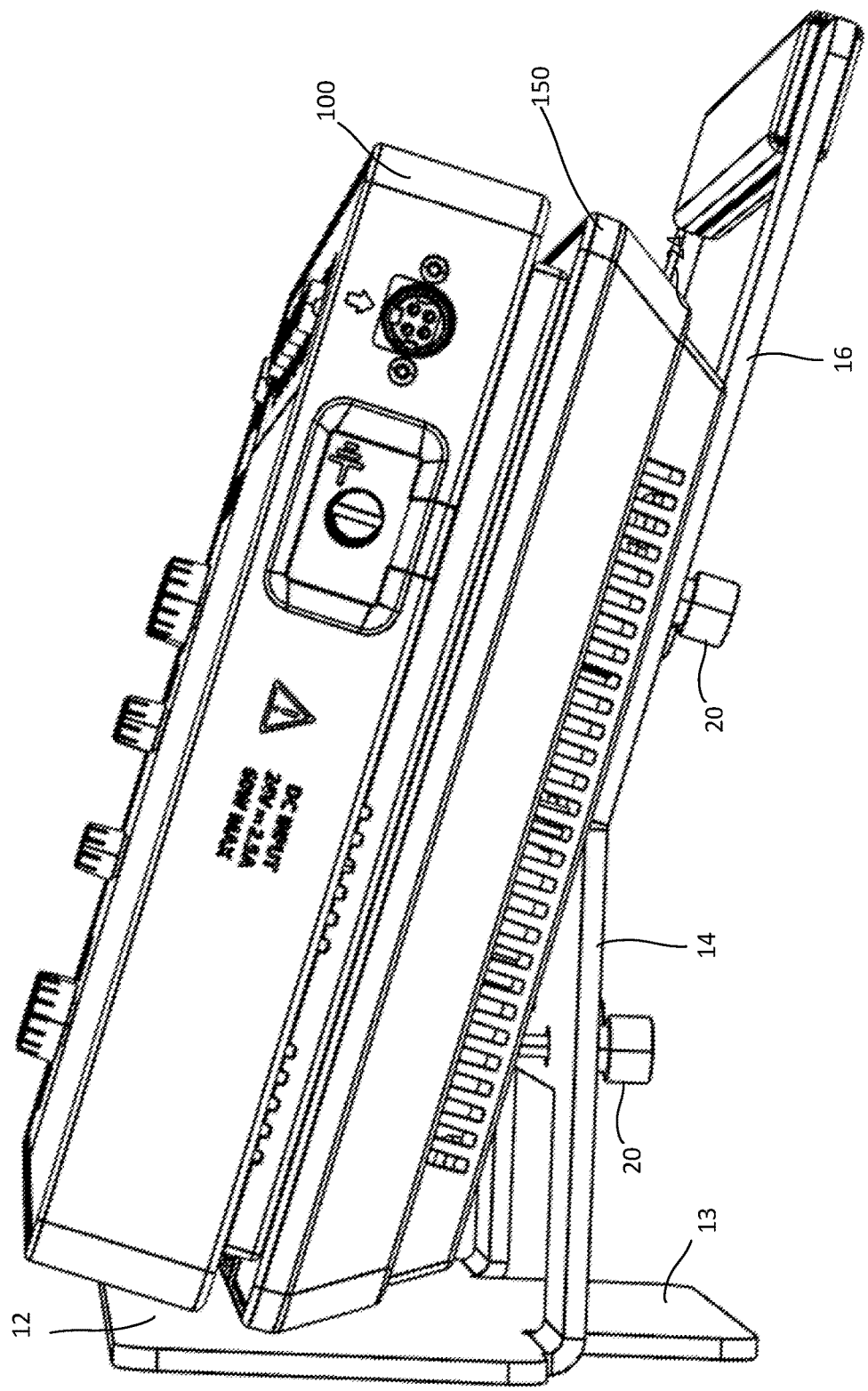
FIG. 15B is a side view of the stand with a test and measurement instrument and battery pack installed in the fourth position of use in which the measurement is rotated from the orientation illustrated in FIG. 15A, according to embodiments of the disclosure.

In some embodiments, the stand 10 may also include an elastomer material 40 attached to the bottom surface of the bottom plate 12, which is depicted in FIG. 13 but may be present in any of the disclosed embodiments. This elastomer material 40 creates a higher frictional force for the bottom plate 12 for gripping a surface than the bottom plate that does not have the elastomer material 40. According to this embodiment, the elastomer material 40 grips the work surface and prevents the stand 10 from slipping along the surface, providing greater stability. Other embodiments of the stand 10 may utilize other polymer materials or any suitable material for providing grip and preventing slippage.

With the exception of FIGS. 11B, 12B, 14B, and 15B, all of the other embodiments have been described with a bottom edge of the instrument 100 adjacent to or aligned with the bottom plate 12. Many of the embodiments described above may also be used by rotating the instrument 180 degrees from its typical position, and then using the mounting screws 20 to attach the instrument 100, or the battery 150, to the stand 10. Such embodiments, as illustrated in FIGS. 11B, 12B, 14B, and 15B, provide even greater flexibility and options for using an instrument stabilized or positioned into a comfortable viewing angle by the stand 10. In the rotated position, the keying index 22, may not necessarily align with a receiver depression formed in the instrument, but the mis-matched keying index 22 does not necessarily prevent the instrument 100, or the instrument and battery 150 from being used with the stand in this manner.

In yet other embodiments, if the weight distribution of the instrument 100 allows, the bottom holes of the instrument may be aligned with and attached by the top mounting screws 20 that are housed by or in the top plate 16. Although not illustrated, such an operating position may be visualized using FIG. 5. But, instead of the lower mounting holes of the instrument 100 secured by the bottom mounting screws 20 that are housed in the middle plate 14, the lower mounting holes of the instrument, or battery pack 150, are secured by the top mounting screws 20 that are housed by or in the top plate 16. Raising the instrument 100 in this manner, from its lower mounted position one to this upper mounted position just described may cause increased instability of the instrument 100 and stand 10. But, in some instances, the stability of the instrument 100, and, optionally, the battery pack 150 with the stand 10 may be adequately stable for some uses.

This written description makes reference to particular features. It is to be understood that the disclosure in this specification includes all possible combinations of those particular features. For example, where a particular feature is disclosed in the context of a particular aspect, that feature can also be used, to the extent possible, in the context of other aspects.

Also, when reference is made in this application to a method having two or more defined steps or operations, the defined steps or operations can be carried out in any order or simultaneously, unless the context excludes those possibilities.

Although specific aspects of the disclosure have been illustrated and described for purposes of illustration, it will be understood that various modifications may be made without departing from the spirit and scope of the disclosure. Accordingly, the disclosure should not be limited except as by the appended claims.

EXAMPLES

Illustrative examples of the technologies disclosed herein are provided below. A configuration of the technologies may include any one or more, and any combination of, the examples described below.

Illustrative examples of the technologies disclosed herein are provided below. A configuration of the technologies may include any one or more, and any combination of, the examples described below.

Example 1 is a stand for receiving a portable test and measurement instrument, including a base plate having a first portion extending orthogonally from the base plate, the first portion including one or more holes spaced in a pattern through which one or more fasteners may attach the test and measurement instrument to the stand, and a second portion adjacent to and extending at an angle from the first portion, the second portion including one or more holes spaced in a pattern through which one or more fasteners may attach the test and measurement instrument to the stand.

Example 2 is a stand according to Example 1, in which the one or more holes in the first portion and second portion are spaced according to Video Electronics Standards Association (VESA) standards.

Example 3 is a stand according to any of the preceding Examples in which the stand is formed from a single piece of material.

Example 4 is a stand according to any of the preceding Examples in which the one or more fasteners of the first portion and second portion are captured screws coupled to the stand.

Example 5 is a stand according to any of the preceding Examples in which an elastomer material is attached to a bottom surface of the base plate, opposite the first portion.

Example 6 is a stand according to any of the preceding Examples in which the test and measurement instrument is coupled to a battery pack disposed between the test and measurement instrument and the stand.

Example 7 is a stand according to any of the preceding Examples in which the stand includes extensions of material from at least one of the first portion and the second portion, wherein the extension is keyed to fit within a recess on a mounting surface of the instrument and align the instrument and stand.

Example 8 is a stand according to any of the preceding Examples further comprising an aperture formed in the second portion.

Example 9 is a stand according to Example 8, further comprising a handle attached to a portion of the stand between an edge of the aperture and an edge of the stand.

Example 10 is a stand according to any of the preceding Examples in which the instrument may be attached adjacent to the first portion of the stand, or attached adjacent to the second portion of the stand, but not attached adjacent to the first portion of the stand and attached adjacent to the second portion of the stand simultaneously.

Example 11 is a stand according to any of the preceding Examples in which the base plate includes a base extension extending from the stand in a direction opposite from the base plate.

Example 12 is a stand according to Example 11, in which a distal edge of the second portion is approximately aligned with an edge of the base extension.

Example 13 is a kit formed of a test and measurement instrument and removable stand, the kit including a stand having a base plate, a first portion of the stand extending orthogonally from the base plate, the first portion including one or more holes spaced in a pattern through which one or more fasteners may extend, and a second portion of the stand extending at an angle from the first portion, the second portion including one or more holes spaced in a pattern through which one or more fasteners may extend; and an instrument structured to be removably attached from the stand, the instrument including one or more holes on a mounting surface thereof, the one or more holes structured to receive the one or more fasteners extending through the one or more holes of the first portion of the stand or the one or more fasteners extending through the one or more holes of the second portion of the stand.

Example 14 is a kit according to Example 13, in which the one or more holes in the first portion and second portion of the stand and on the mounting surface of the instrument are spaced according to Video Electronics Standards Association (VESA) standards.

Example 15 is a kit according to any of the above Examples 13-14, in which the stand is formed from a single piece of material.

Example 16 is a kit according to any of the preceding Examples 13-15 in which the one or more fasteners of the first portion and second portion are captured screws.

Example 17 is a kit according to any of the preceding Examples 13-16, further comprising an elastomer material attached to a bottom surface of the base plate of the stand, opposite the first portion.

Example 18 is a kit according to any of the preceding Examples 13-17, further comprising a battery pack structured to be disposed between the test and measurement instrument and the stand, the battery pack including one or more holes on a mounting surface thereof, the one or more holes structured to receive the one or more fasteners extending through the one or more holes of the first portion of the stand or the one or more fasteners extending through the one or more holes of the second portion of the stand.

Example 19 is a kit according to any of the preceding Examples 13-18 in which the base plate of the stand includes a base extension extending from the stand in a direction opposite from the base plate.

Example 20 is a kit according to Example 19 in which a distal edge of the second portion of the stand is approximately aligned with an edge of the base extension of the stand.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Also, directions such as "left," "right," "top," "bottom," "horizontal," and "vertical" are used for convenience and in reference to the views provided in figures. But the disclosed technology may have a number of orientations in actual use. Thus, a feature that is on top or on the bottom in the figures may not have that same orientation or direction in actual use.

Although specific examples of the invention have been illustrated and described for purposes of illustration, it will be understood that various modifications may be made without departing from the spirit and scope of the invention. Accordingly, the invention should not be limited except as by the appended claims.

We claim:

1. A stand for receiving a portable test and measurement instrument, comprising:
   a base plate;
   a first portion extending orthogonally from the base plate, the first portion including one or more holes spaced in a pattern through which one or more fasteners may attach the test and measurement instrument to the stand; and
   a second portion adjacent to and extending at an angle from the first portion, the second portion including one or more holes spaced in a pattern through which one or more fasteners may attach the test and measurement instrument to the stand.

2. The stand according to claim 1 in which the one or more holes in the first portion and second portion are spaced according to Video Electronics Standards Association (VESA) standards.

3. The stand according to claim 1 in which the stand is formed from a single piece of material.

4. The stand according to claim 1 in which the one or more fasteners of the first portion and second portion are captured screws coupled to the stand.

5. The stand according to claim 1 in which an elastomer material is attached to a bottom surface of the base plate, opposite the first portion.

6. The stand according to claim 1 in which the test and measurement instrument is coupled to a battery pack disposed between the test and measurement instrument and the stand.

7. The stand according to claim 1 in which the stand includes extensions of material from at least one of the first portion and the second portion, wherein the extension is keyed to fit within a recess on a mounting surface of the instrument and align the instrument and stand.

8. The stand according to claim 1, further comprising an aperture formed in the second portion.

9. The stand according to claim 8, further comprising a handle attached to a portion of the stand between an edge of the aperture and an edge of the stand.

10. The stand according to claim 1, in which the instrument may be attached adjacent to the first portion of the stand, or attached adjacent to the second portion of the stand, but not attached adjacent to the first portion of the stand and attached adjacent to the second portion of the stand simultaneously.

11. The stand according to claim 1, in which the base plate includes a base extension extending from the stand in a direction opposite from the base plate.

12. The stand according to claim 11, in which a distal edge of the second portion is approximately aligned with an edge of the base extension.

13. A kit formed of a test and measurement instrument and removable stand, the kit comprising:
    a stand including:
        a base plate,
        a first portion of the stand extending orthogonally from the base plate, the first portion including one or more holes spaced in a pattern through which one or more fasteners may extend, and
        a second portion of the stand extending at an angle from the first portion, the second portion including one or more holes spaced in a pattern through which one or more fasteners may extend; and
    an instrument structured to be removably attached from the stand, the instrument including one or more holes on a mounting surface thereof, the one or more holes structured to receive the one or more fasteners extending through the one or more holes of the first portion of the stand or the one or more fasteners extending through the one or more holes of the second portion of the stand.

14. The kit according to claim 13 in which the one or more holes in the first portion and second portion of the stand and on the mounting surface of the instrument are spaced according to Video Electronics Standards Association (VESA) standards.

15. The kit according to claim 13 in which the stand is formed from a single piece of material.

16. The kit according to claim 13 in which the one or more fasteners of the first portion and second portion are captured screws.

17. The kit according to claim 13, further comprising an elastomer material attached to a bottom surface of the base plate of the stand, opposite the first portion.

18. The kit according to claim 13, further comprising a battery pack structured to be disposed between the test and measurement instrument and the stand, the battery pack including one or more holes on a mounting surface thereof, the one or more holes structured to receive the one or more fasteners extending through the one or more holes of the first portion of the stand or the one or more fasteners extending through the one or more holes of the second portion of the stand.

19. The kit according to claim 13, in which the base plate of the stand includes a base extension extending from the stand in a direction opposite from the base plate.

20. The kit according to claim 19, in which a distal edge of the second portion of the stand is approximately aligned with an edge of the base extension of the stand.

* * * * *